United States Patent [19]

Iwai

[11] Patent Number: 4,994,851
[45] Date of Patent: Feb. 19, 1991

[54] PHOTOSENSITIVE SHEET REWIND DEVICE FOR IMAGE FORMING APPARATUS

[75] Inventor: Shougo Iwai, Yamatokoriyama, Japan

[73] Assignee: Sharp Kabushiki Kaisha, Osaka, Japan

[21] Appl. No.: 489,515

[22] Filed: Mar. 7, 1990

[30] Foreign Application Priority Data

Mar. 7, 1989 [JP] Japan .................. 1-54354

[51] Int. Cl.$^5$ .............. G03B 27/48; G03B 27/50; G03B 27/70
[52] U.S. Cl. .................. 355/50; 242/57; 352/124; 355/72
[58] Field of Search ........... 355/50, 51, 72; 242/55, 242/57, 67.4; 226/90, 49; 352/124

[56] References Cited

U.S. PATENT DOCUMENTS

| | | | |
|---|---|---|---|
| 3,690,750 | 9/1972 | Taillon | 352/124 |
| 3,700,186 | 10/1972 | Burnham | 352/124 X |
| 3,782,666 | 1/1974 | Sandrone et al. | 242/57 X |
| 4,705,958 | 11/1987 | Sugita | 355/50 X |
| 4,811,058 | 3/1989 | LaCourt | 355/72 |
| 4,925,121 | 5/1990 | Tapscott et al. | 242/57 |

FOREIGN PATENT DOCUMENTS

63-101851 5/1988 Japan.

Primary Examiner—Richard A. Wintercorn

[57] ABSTRACT

A rewind device for a photosensitive sheet in an image forming apparatus comprises a supply shaft reversing device which winds back the photosensitive sheet by rotating a supply shaft rotatively supporting a photosensitive sheet roll in the reverse direction to the drawing direction of the photosensitive sheet and a control device which measures a rotation amount of the photosensitive sheet roll in the drawing direction for the photosensitive sheet and that in the reverse direction. The control device is composed so that it may stop the winding back of the photosensitive sheet by the supply shaft reversing device in order to constantly wind back a fixed amount of the photosensitive sheet by comparing both of the rotation amounts.

14 Claims, 7 Drawing Sheets

PHOTOSENSITIVE SHEET REWIND DEVICE FOR IMAGE FORMING APPARATUS

FIELD OF THE INVENTION

The present invention relates to a rewind device for photosensitive sheet for use in an image forming apparatus of the photosensitive latent image transfer type which forms a visible image by pressing an image receiving sheet onto a portion of a photosensitive sheet which is successively drawn from a photosensitive sheet roll, and has a latent image formed thereon.

BACKGROUND OF THE INVENTION

An image forming apparatus of the photosensitive latent image transfer type is composed so that it may form a visible image by pressing an image receiving sheet onto a portion of a photosensitive sheet at a pressure part therein, which is successively drawn from a photosensitive sheet roll and has latent images formed thereon at an irradiation part in the apparatus. However, there is a fixed distance between the irradiation part and the pressure part. Consequently, when a portion of a photosensitive sheet having a latent image formed thereon is carried to the pressure part, some portion of the photosensitive sheet between the pressure part and the irradiation part remains unexposed. Accordingly, if the next exposure is started in this condition, the unexposed portion is wastefully drawn without any treatment.

Therefore it is suggested that a distance corresponding to the unexposed portion of the photosensitive sheet should be wound back every time the formation of visible image at the pressure part is completed. Thus rewind devices for photosensitive sheet have already been developed, which may eliminate the above wastefulness by starting the next exposure at a portion immediately after the portion having been exposed in the preceding operation (hereinafter called exposure portion). As one of these rewind devices, for example, is known a disclosure (Application No. 63-101851) of Japanese Publication for Unexamined Patent.

Figure 7:
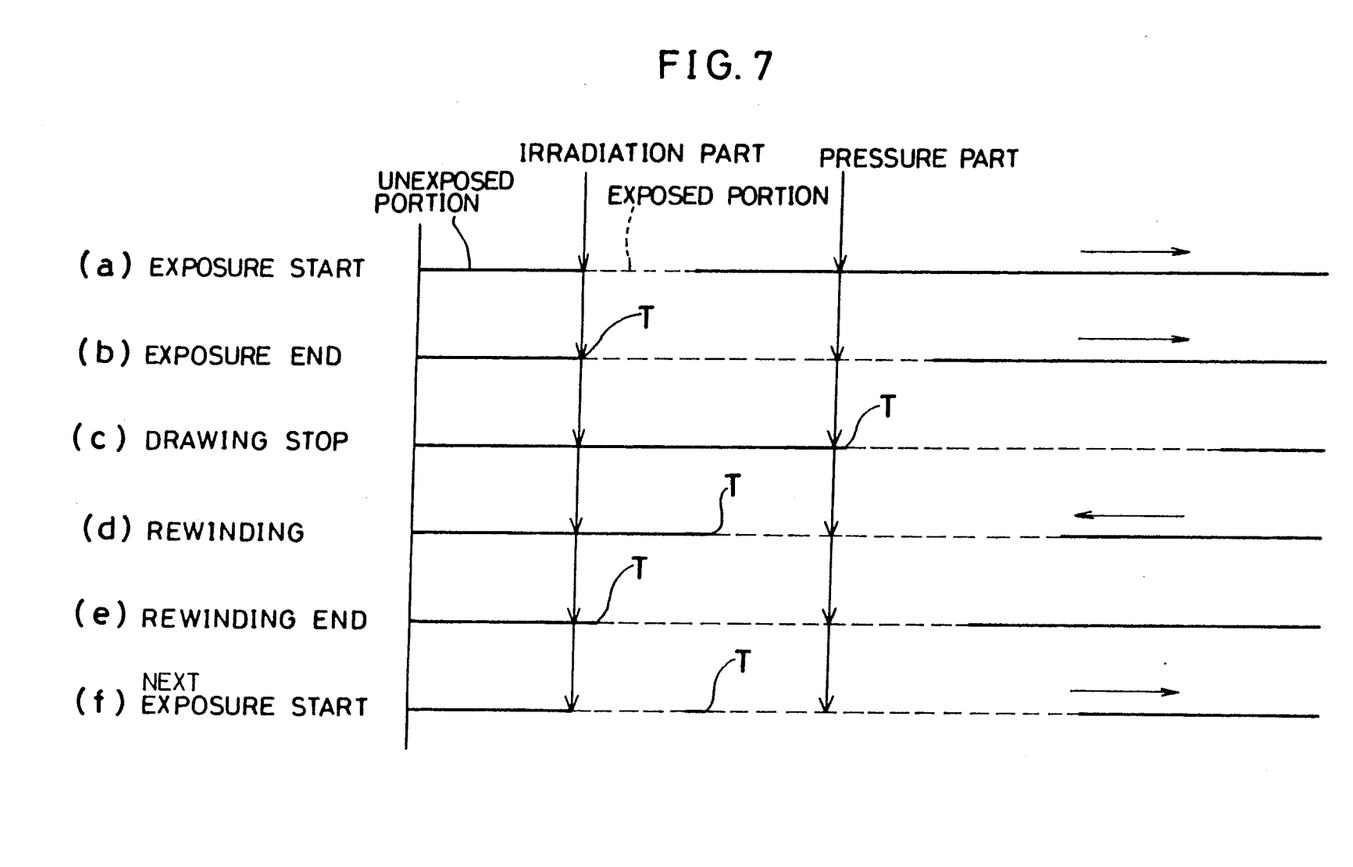
FIG. 7 is a schematic illustration showing the action of a photosensitive sheet operated by a rewind device in a conventional example.

More specifically, as shown in FIG. 7(a), in the image forming apparatuses having such a rewind device, at first an exposure is started at the irradiation part in the apparatus while a portion of a photosensitive sheet is being drawn from a photosensitive sheet roll(in the figure, an unexposure portion of a photosensitive sheet is shown with thick solid lines and an exposed portion thereof is shown with broken lines). Simultaneously as the exposure portion is carried to the pressure part in the apparatus by the drawing of the photosensitive sheet, an image receiving sheet is pressed onto the exposure portion and thereby a visible image is formed on the image receiving sheet. Thus as shown in FIG. 7(b), after the completion of the exposure at the irradiation part, a further drawing of the photosensitive sheet is continued until the rear edge of the exposure portion T reaches the pressure part.

In this way, when the formation of visible image on the image receiving sheet is completed, the drawing of the Photosensitive sheet is stopped for a moment as shown in FIG. 7(c). Next as shown in FIG. 7(d), the rewind device is actuated to wind back the photosensitive sheet. The winding back by the rewind device is performed until the rear edge of the exposure portion T reaches just before the irradiation part as shown in FIG. 7(e). Consequently, as shown in FIG. 7(f), by starting the next exposure after the completion of the winding back operation, a wasteful consumption of the photosensitive sheet is preventable since the unexposed portion between the newly exposed portion and the preceding one is reduced to a small amount.

However, in the method wherein a photosensitive sheet is simply wound back by reversely rotating a supply shaft of the photosensitive sheet roll, it is difficult to wind back the photosensitive sheet accurately just before the irradiation part. This is because the outside diameter of the photosensitive sheet roll varies depending on the remaining amount of the photosensitive sheet, and therefore the rewind amount per one rotation differs according to the outside diameter of the photosensitive sheet roll. Consequently, in the conventional photosensitive sheet rewind devices, a fixed rewind amount is predeterminately set in a control part since a distance between the irradiation part and the pressure part is constant. Thus the photosensitive sheet at the distance corresponding to the preset rewind amount is wound back by the control operation.

However, when the movement of the fixed distance like this is applied not only to the drawing operation for the photosensitive sheet but also to the winding back operation, the same control as in the drawing operation is necessary. As a result, the conventional rewind devices have problems in that they need a complicated composition and therefore their costs are very high due to the necessity of controlling a driving device for photosensitive sheet in both the drawing operation and the winding back operation.

SUMMARY OF THE INVENTION

It is an object of the present invention to provide a rewind device for a photosensitive sheet which, by adding a simple composition thereto, may constantly wind back a fixed amount of photosensitive sheet simply by reversely rotating a supply shaft for photosensitive sheet, and thereby may minimize a wasteful consumption of unexposed portion of photosensitive sheet.

In order to achieve the above object, a rewind device for photosensitive sheet according to the present invention comprises a supply shaft reversing device for winding back a photosensitive sheet by rotating a supply shaft rotatively supporting the photosensitive sheet roll in the reverse direction to the drawing direction of photosensitive sheet, a rotation detector for detecting the amount of rotation made by the photosensitive sheet roll, which is secured to the rotation system of the supply shaft, measuring means for measuring the rotation amount of the photosensitive sheet roll in the drawing direction which is detected by the rotation detector in a fixed period of time as well as that in the reverse direction, rewind start means for starting the winding back of photosensitive sheet by the supply shaft reversing device after the rear edge of an exposure portion on the photosensitive sheet reached a pressure part and rewind stop means for stopping the winding back of the photosensitive sheet by the supply shaft reversing device according to the comparison between the rotation amounts in both of the directions measured by the measuring means.

In the above composition, when a photosensitive sheet is drawn from the photosensitive sheet roll, the rotation detector detects the rotation amount of the photosensitive sheet roll.

The measuring means measures the rotation amount of the photosensitive sheet roll in the drawing direction of the photosensitive sheet (hereinafter called regular direction rotation amount) detected by the rotation detector in a period from the time when the rear edge of an exposure portion of the photosensitive sheet passed through an irradiation part, which will be described later, in the image forming apparatus until it reaches a pressure part, which will be described later. The irradiation part is a place wherein latent images are formed on the photosensitive sheet successively drawn from the photosensitive sheet roll. Moreover, the pressure part is a place wherein a visible image is formed on an image receiving sheet by pressing the image receiving sheet onto the portion of the photosensitive sheet having a latent image formed thereon.

The regular direction rotation amount measured by the measuring means corresponds to the rotation amount of the supply shaft which is marked when the photosensitive sheet is drawn at a fixed distance form the irradiation part to the pressure part. The rotation amount shows a value corresponding to the remaining amount of the photosensitive sheet at the time. This is because the drawing speed of the photosensitive sheet is always set constant and, therefore, the rotation amount is smaller when the outside diameter of the photosensitive sheet roll is bigger and it becomes greater as the diameter becomes smaller.

When the rear edge of the latent image of the photosensitive sheet reaches the pressure part, since the formation of a visible image has been completed, the drawing of the photosensitive sheet is stopped. Then the rewind start means permits the supply shaft reversing device to wind back the photosensitive sheet. The supply shaft reversing device performs the winding back of the photosensitive sheet simply by rotating the supply shaft rotatively supporting the photosensitive sheet roll in the reverse direction to the drawing direction of the photosensitive sheet.

The above measuring means also measures the rotation amount of the photosensitive sheet roll(hereinafter called reverse direction rotation amount) detected by the rotation detector after the winding back start for the photosensitive sheet.

Hereupon, the rewind stop means compares the regular direction rotation amount in the preceding measurement with the reverse direction rotation amount in the succeeding measurement at all times, and stops the winding back of the photosensitive sheet by the supply shaft reversing device based on the comparison. If the rotation detector is composed so that it may detect the fixed number of rotations or the fixed angles of the rotation made by the supply shaft regardless of the directions of the rotation, the rewind stop means may stop the winding back operation when both of the regular direction rotation amount and the reverse direction rotation amount agree with each other.

Thus the photosensitive sheet is wound back so that the preceding exposure portion of the photosensitive sheet may be located just before the irradiation part. Consequently, the formation of the succeeding latent image is started from the rear edge of the preceding latent image or from a little behind it, and therefore a wasteful consumption of unexposed portion of the photosensitive sheet is preventable.

Moreover, since the supply shaft reversing device may be operated simply to rotate the supply shaft in reverse at an optional speed until it is instructed to stop, the device may be composed of a very simple rotation transmission device or the like.

For a fuller understanding of the nature and advantages of the invention, reference should be made to the ensuing detailed description taken in conjunction with the accompanying drawings.

BRIEF DESCRIPTION OF THE DRAWINGS

FIGS. 1 to 6 show one way of preferred embodiment of the present invention.

DESCRIPTION OF THE EMBODIMENTS

One way of carrying out the present invention is described in detail with reference to FIGS. to 6 as follows.

(a) Structure of Copying Machine

Figure 1:
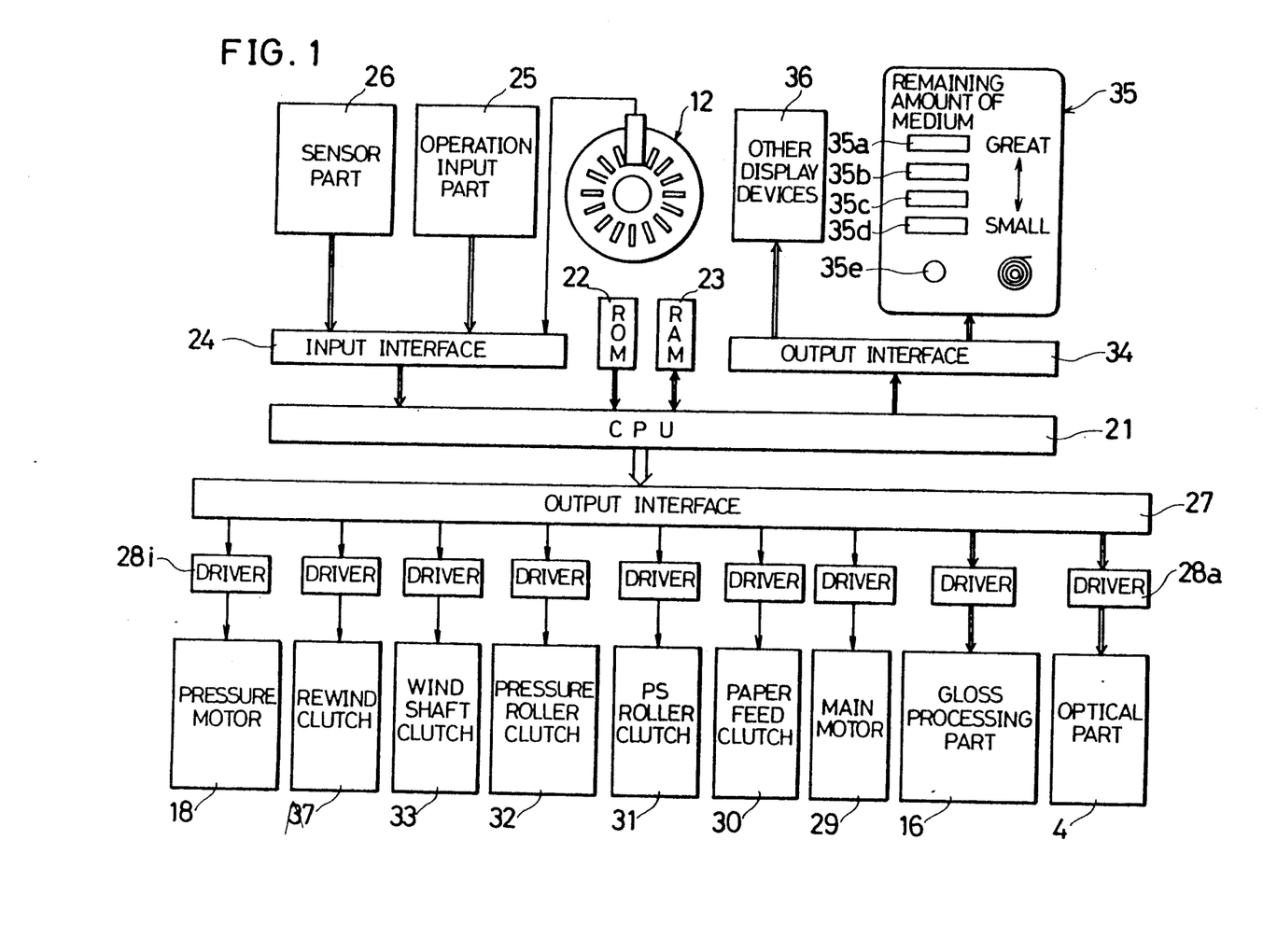
FIG. 1 is a block diagram showing the composition of a control part in a copying machine.
Figure 2:
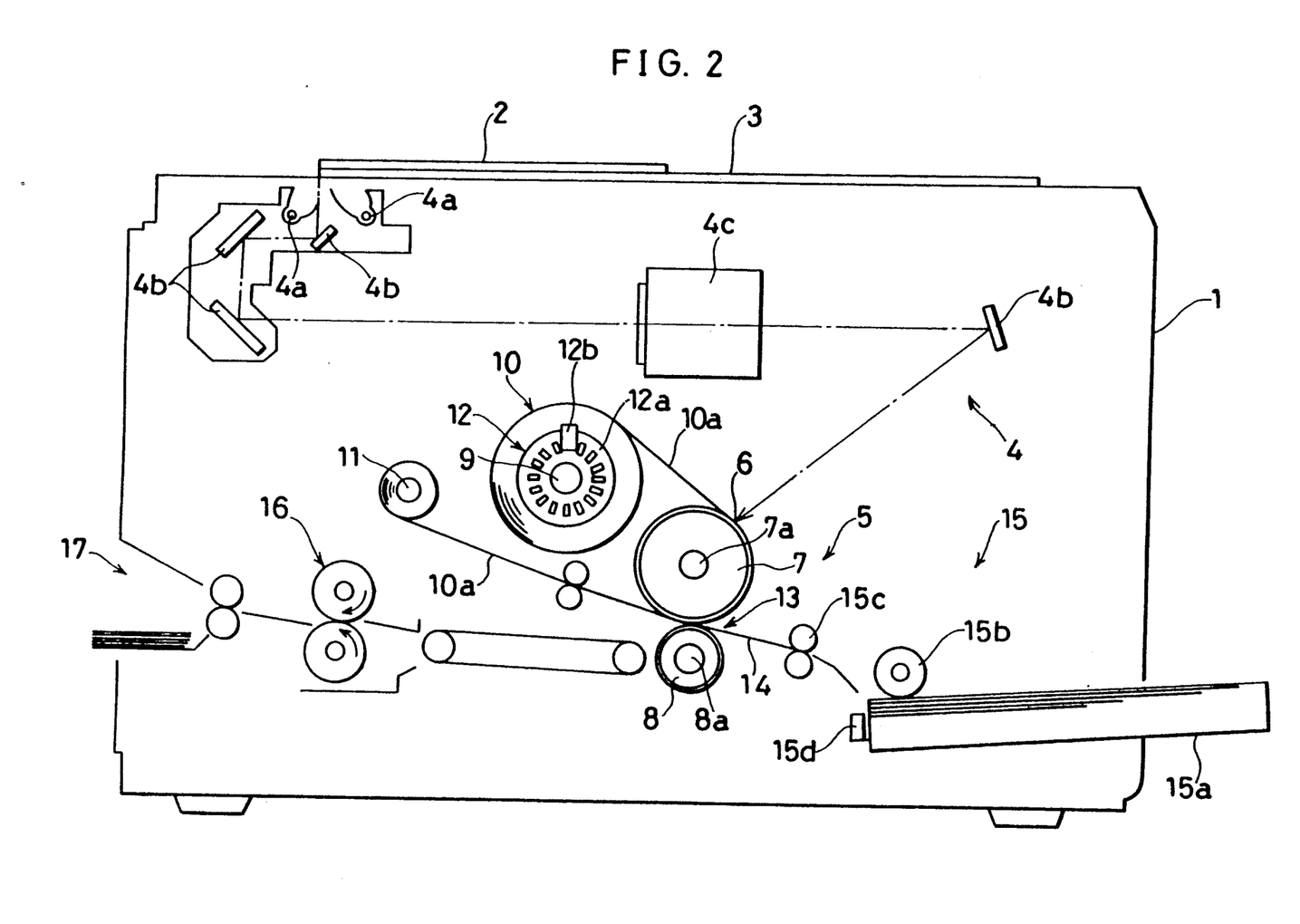
FIG. 2 is a front view of a copying machine showing its schematic internal structure.
Figure 6:
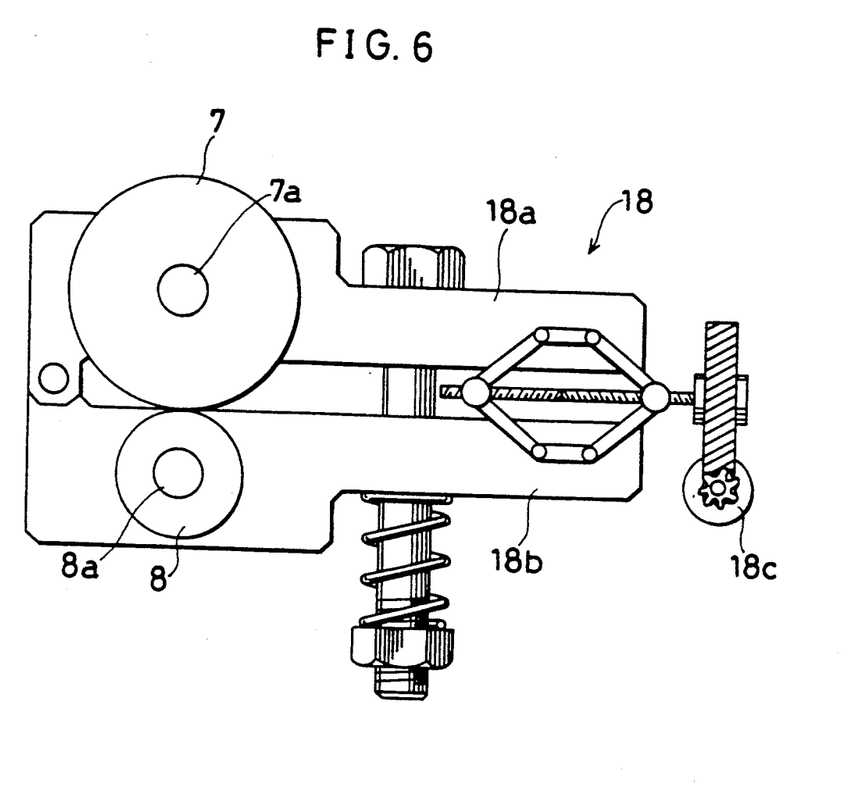
FIG. 6 is a partially enlarged front view showing a pressure device in a pressure roller.

The present embodiment deals with a copying machine shown FIGS. 1, 2 and 6. The copying machine is an example of image forming apparatuses employing a photosensitive sheet which is a photosensitive-pressure sensitive type medium. As shown in FIG. 2. on the upper part of a copying machine body 1, there is a document table 3 for placing a document 2 thereon. Under the document table 3, there is installed an image forming processing part 5 having an optical part 4 in between. The optical part 4 comprises a pair of light source lamps 4a, a plurality of reflecting mirrors 4b and a lens 4c. The light source lamps 4a scan the document 2 as is similar to an ordinary optical system shifting type copying machine. Next, the optical image of the document 2 is led to an irradiation part 6 in the image forming processing part 5 through the reflecting mirrors 4b and the lens 4c.

The image forming processing part 5 comprises a main drum 7 which is rotatively driven at a fixed speed when images are formed and a pressure roller 8 which rotates accompanying the rotations of the main drum 7. The pressure roller 8 is located under the main drum 7 with their shafts parallel to each other.

The rotary shaft 7a of the main drum 7 and the rotary shaft 8a of the pressure roller 8 are respectively supported by the supporting member 18a and movable member 18b of a pressure device 18 so that they may rotate freely as shown in FIG. 6. The pressure device 18 may move the movable member 18b in the leaving direction or approaching direction from/to the supporting member 18a by the rotations of a pressure motor 18c. Accordingly, by controlling the rotation directions of the pressure motor 18c in the pressure device 18, depressing or removing of the pressure roller 8 to/from the main drum 7 may be performed.

As shown in FIG. 2, a photosensitive sheet supply shaft 9 is located parallel to the shaft of the main drum 7 diagonally to the upper left of the main drum 7. To the photosensitive sheet supply shaft 9, a photosensitive sheet roll 10 having a photosensitive sheet 10a wound up thereon is fitted, and it is rotatively supported by the shaft. Consequently, the photosensitive sheet supply shaft 9 and the rotary shaft 7a of the main drum 7 rotate in the same direction, and the photosensitive sheet 10a is drawn from the circumference of the photosensitive sheet roll 10 diagonally to the lower right of the photosensitive sheet roll 10.(as to the rotation directions of the photosensitive sheet supply shaft 9, hereinafter the direction wherein the photosensitive sheet 10a is drawn is called the regular direction, and the opposite direction wherein the photosensitive sheet 10a is wound back is called the reverse direction.)

The photosensitive sheet 10a thus drawn is wound halfway round the main drum 7 and wound up by a photosensitive sheet wind shaft 11 after passing through the main drum 7 and the pressure drum 8. During this step, a backward tension to the drawing direction is applied to the photosensitive sheet 10a by a structure(-not shown). Moreover, the photosensitive sheet wind shaft 11 is rotatively driven in the winding direction through a friction member which permits slipping when more than a fixed amount of torque is applied. Consequently, the photosensitive sheet 10a may maintain a proper tension when it is drawn at a fixed speed from the photosensitive sheet roll 10 by the rotative drive of the main drum 7 so as to form images, and is wound up around the photosensitive sheet wind shaft 11.

Furthermore, the photosensitive sheet supply shaft 9 is also rotatively driven in the reverse direction by the use of a rewind clutch 37 (See FIG. 1) as a supply shaft reversing device which will be described later.

The photosensitive sheet supply shaft 9 also has a rotary encoder 12 fixed thereon as a rotation detector. The rotary encoder 12 comprises a disc 12a having slits formed through it at every fixed interval on the same circumference and a photo interrupter 12b disposed having the disc 12a in between its light emitting element and light receiving one. The photo interrupter 12b generates light pulses with a fixed time rate to the rotation cycle of the disc 12a regardless of the rotation direction of the supply shaft 9 as the photosensitive sheet roll 10 rotates together with the photosensitive sheet supply shaft 9. Thus the rotation amount of the photosensitive sheet supply shaft 9 is detected by converting the intensity of the light pulses varying due to the slits of the disc 12a into electric signals.

The above photosensitive sheet 10a serves as a photosensitive-pressure sensitive medium in the image forming apparatus. As a concrete example, such a metal sheet as reflects light like aluminum or the like is employed, on the surface of which micro-capsules containing leuco ink as a dye intermediate and photo-hardening substance as a photosensitive substance are coated.

The vicinity of the part from which the photosensitive sheet 10a is started to be wound around the main drum 7 forms an irradiation part 6 on which the optical image is led through the above-mentioned optical part 4. Then the photo-hardening substance contained in the capsules is exposed on the irradiation part 6, and a latent image is formed on a portion of the photosensitive sheet 10a.

On the other hand, the part wherein a portion of the photosensitive sheet 10a wound half around the main drum 7 is depressed by the pressure roller 8 forms a pressure part 13 in the image forming processing part 5. An image receiving sheet 14 on which developing substances and thermal plastic resins are coated is supplied to the pressure part 13, and the image receiving sheet 14 is depressed on the photosensitive sheet 10a by the pressure roller 8.

In this way, when the photosensitive sheet 10a and the image receiving sheet 14 are simultaneously contacted and depressed each other in the pressure part 13, the micro-capsules on the photosensitive sheet 10a, which have not been exposed(accordingly, not hardened), are ruptured and the leuco ink contained therein reacts on the developing substances, and therefore a visible image is formed on the image receiving sheet 14.

It is a paper feed part 15 located in front of the image forming processing part 5 that supplies the image receiving sheets 14 to the pressure part 13. The paper feed part 15 feeds image receiving sheets 14, many of which are kept in a paper feed cassette 15a, to a PS roller 15c one by one by the use of a paper feed roller 15b. The PS roller 15c supplies the image receiving sheets 14 to the pressure part 13 with a predetermined timing. Moreover, to the leading edge of the paper feed cassette 15a, is secured a sheet size detector 15d for detecting the size of the image receiving sheets 14 stored in the paper feed cassette 15a.

The image receiving sheet 14 which has passed through the pressure part 13 is ejected into a paper ejection part 17 after being processed in the gloss processing part 16. In the gloss processing part 16, the image receiving sheet 14 is heated by a heat roller so that the thermal plastic resin coated thereon may be melted. Thus the image receiving sheet 14 having the image formed thereon obtains gloss on its surface.

(b) Structure of Control Part

In the photosensitive sheet rewind device in accordance with the present invention, it is possible to compose its measuring means, rewind start means and rewind stop means, for example, by the use of micro-computers.

The following description deals with the composition of the control part of the above-mentioned copying machine referring to FIG. 1.

The copying machine is controlled by CPU 21 (Central Processing Unit). The CPU 21 performs control operations while using RAM 23 as a work area according to control programs written in ROM 22.

To the CPU 21 through an input interface 24, are entered signals released from an operation input part 25 and a sensor part 26 as well as the count numbers of pulses according to pulse signals released from the rotary encoder 12. The input interface 24 comprises a counter which counts pulse signals released from the rotary encoder 12. The operation input part 25 functions as an input device comprising an operation panel(-not shown) of the copying machine which receives operations from the operator. The sensor part 26 comprises various sensors respectively positioned in the apparatus body 1 including the sheet size detector 15d.

The outputs of the CPU 21 are respectively connected to the optical part 4, the gloss processing part 16, a main motor 29, a paper feed clutch 30, a PS roller clutch 31, a pressure roller clutch 32, a wind shaft clutch 33, the rewind clutch 37 and the pressure motor 18c through an output interface 27 by the use of respective drivers 28a to 28i.

The main motor 29 functions as a driving power source for various driving parts in the copying machine. The paper feed clutch 30 transmits the rotations of the main motor 29 to the paper feed roller 15b in the paper feed part 15. The PS roller clutch 31 transmits the rotations of the main motor 29 to the PS roller 15c in the paper feed part 15. The pressure roller clutch 32 transmits the rotations of the main motor 29 to the main drum 7. The wind shaft clutch 33 transmits the rotations of the main motor 29 to the photosensitive sheet wind shaft 11. The rewind clutch 37 transmits the rotations of the main motor 29 to the photosensitive sheet supply shaft 9 so as to rotatively drive the photosensitive sheet 10a in the reverse direction. As is mentioned before, the pressure motor 18c releasably depresses the pressure roller 8 to the main drum 7 by driving the pressure device 18.

Moreover, the outputs of the CPU 21 are connected to a remaining amount display device 35 and other display devices 36 through an output interface 34. The remaining amount display device 35 is installed in the operation panel of the copying machine, and comprises four remaining amount indicator lamps 35a to 35d as well as an exchange indicator lamp 35e. These four remaining amount indicator lamps 35a to 35d indicate the remaining amount of the photosensitive sheet 10a by the number of the lights on. The exchange indicator lamp 35e indicates the necessity of exchanging the photosensitive sheet roll 10 by turning on and off when the amount of photosensitive sheet 10a gets small. The other display devices 36 are installed in the operation panel of the copying machine so as to perform various indications besides those for the remaining amount of the photosensitive sheet 10a.

Operations of Control Part (1)

Figure 3:
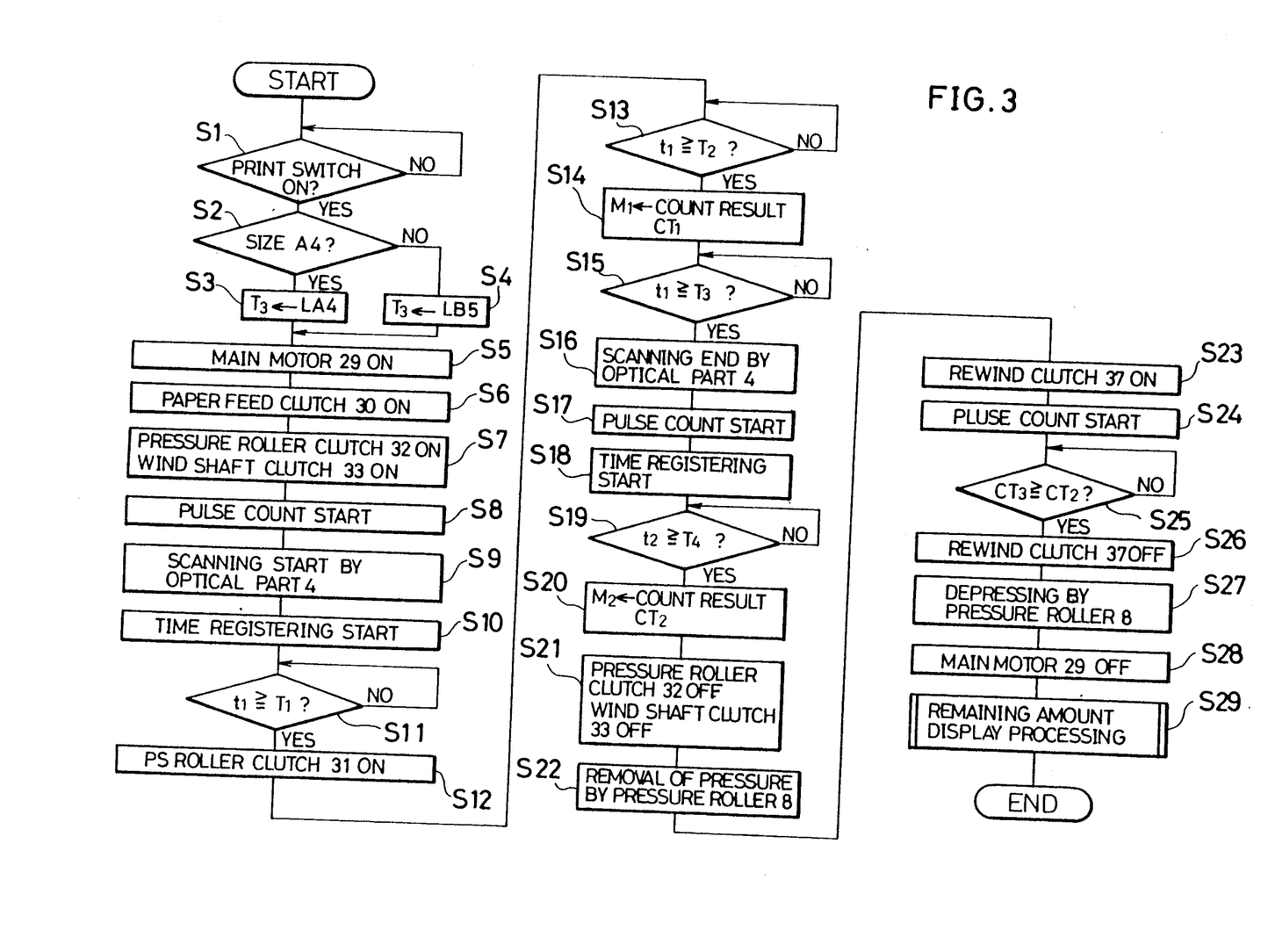
FIG. 3 is a flow chart showing an operation of a control part in a copying machine.
Figure 4:
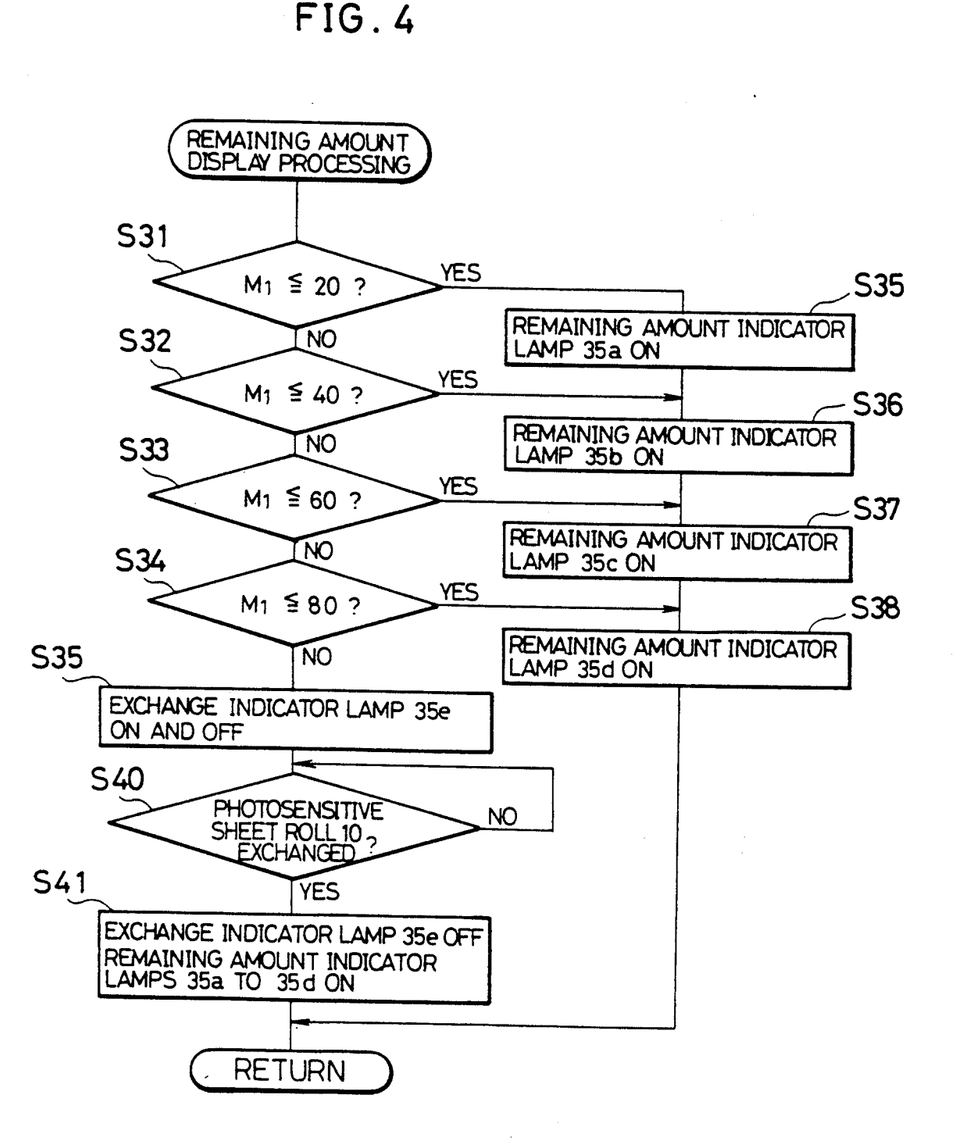
FIG. 4 is a detailed flowchart showing a remaining amount display processing in FIG. 3.

An example of operations is shown with respect to the control part of a copying machine having the above composition referring to flow charts in FIGS. 3 and 4.

As shown in FIG. 3, at first a copying process is initiated when a print switch (not shown) is pressed in the operation input part 25 by the operator at Step 1 (hereinafter given as numbers preceded by S). Next, the size of image receiving sheets 14 kept in the paper feed cassette 15a is recognized according to the output from the sheet size detector 15d in the sensor part 26 (S2). In the case of the copying machine which deals with the sheets of paper of size A4 or B5, at first it is recognized whether the size of the image receiving sheets is A4 or not. Then, if the size of the image receiving sheets 14 is not A4, the size is recognized as B5. When the size of the image receiving sheets 14 is recognized as A4, a constant LA4 equal to the value of transport time for the image receiving sheets 14 of size A4 is stored in an area preset on the RAM 23 as a period variable $T_3$ (S3). When the size of the image receiving sheets 14 is recognized as B5, a constant LB5 equal to the value of a transport time for the image receiving sheets 14 of size B5 is stored in an area preset on the RAM 23 as a period variable $T_3$ (S4). The constant LA4 as well as LB5 is determined according to each length in the transporting direction of the respective image receiving sheets 14 of size A4 and B5, and is predeterminately stored in the ROM 22.

Next, simultaneously as the main motor 29 is driven (S5), the paper feed clutch 30 is actuated to transmit the rotations of the main motor 29 to the paper feed roller 15b. Consequently, one of the image receiving sheets 14 kept in the paper feed cassette 15a is fed to the pressure part 13 (S6). Besides, the image receiving sheet 14 fed at S6 stops at the PS roller 15c for a certain period of time.

On the other hand, simultaneously as the main motor 29 is actuated to drive, the pressure roller clutch 32 and the wind shaft clutch 33 are also actuated to transmit the rotations to the main drum 7 and the photosensitive sheet wind shaft 11. Consequently, a photosensitive sheet 10a is drawn from the photosensitive sheet roll 10 (S7). when the drawing of the photosensitive sheet is initiated, light pulse emission in the rotary encoder 12 is also started accompanying the rotations of the photosensitive sheet supply shaft 9. Next, the counter of the input interface 24 starts counting pulse signals which are converted into electric signals by the photo interrupter 12b (S8). Furthermore, when the drawing of the photosensitive sheet 10a is initiated, scanning to the document 2 is started by the optical part 4 (S9), and simultaneously as a latent image is formed on the photosensitive sheet 10a at the irradiation part 6, time registering is started (S10).

When the time registering is started, a registered period of time $t_1$ as a variable and a period constant $T_1$ are compared each other (11). The period constant $T_1$ is predeterminately stored in ROM 22 in order to synchronize both of the leading edge of the latent image formed on the photosensitive sheet 10a at the irradiation part 6 and the same of the image receiving sheet 14 to reach the pressure part 13 at the same time. The value of the period constant $T_1$ is, more concretely, preset so that it may become equal to a period of time required for the photosensitive sheet 10a, which is wound onto the main drum 7, to be transferred to a fixed position on a way from the irradiation part 6 to the pressure part 13.

When the registered period of time $t_1$ becomes equal to the value of the period constant $T_1$, the PS roller clutch 31 is actuated to transmit the rotation of the main motor 29 to the PS roller 15c. Consequently, the image receiving sheet 14, which has been stopped for a certain period of time, is transferred by the PS roller 15c and fed to the pressure part 13 in the image forming processing part 5 (S12).

When the PS roller clutch 31 is actuated, the registered period of time $t_1$ is compared with a period constant $T_2$ which is predeterminately stored in the ROM 22 (S13). The value of the period constant $T_2$ is preset at a fixed figure between the value of the period constant $T_1$ and that of the aforementioned period variable $T_3$. When the registered period of time $t_1$ becomes equal to the value of the period constant $T_2$, a count result $CT_1$ for the pulse signals by the counter of the input interface 24 is stored in the area preset on the RAM 23 as a variable $M_1$ (S14). The count result $CT_1$ varies depending on the remaining amount of the photosensitive sheet roll 10, and is used in remaining amount display processing for the photosensitive sheet roll 10, which will be described later. Accordingly, the value of the variable $M_1$ is expressed as the number of registered light pulses emitted by the rotary encoder 12 during the passage of a fixed preset time (period constant $T_2$) since the initiation of the drawing of the photosensitive sheet 10a.

When the registered period of time $t_1$ exceeds the value of the period constant $T_2$, it is further compared with the period variable $T_3$ (S15). The value of the period variable $T_3$, as is mentioned above, is equal to a period of transport time preset according to the length in the transport direction of the image receiving sheet 14 fed thereto. Accordingly, when the registered period of time $t_1$ becomes equal to the value of the period variable $T_3$, it is noted that the photosensitive sheet 10a is transferred at the same distance as the length in the transport direction of the image receiving sheet 14 of the corresponding size. At this point of time, the latent image of the document 2 has been formed on the photosensitive sheet 10a, and therefore the scanning by the optical part 4 is also completed (S16).

However, at this point of time, the rear edge of the latent image on the photosensitive sheet 10a is still at the irradiation part 6. Consequently, simultaneously as the counting for pulse signals released from the rotary encoder 12 is newly started (S17), time registering is also newly started (S18). The reason why the new time registering is performed is that the above period variable $T_3$, that is to say, a period of time required for latent image formation changes depending on the size of the supplied image receiving sheet 14, and therefore the counting start time for the pulse signals also varies. The registered period of time $t_2$ as a variable is compared with the period constant $T_4$ predeterminately stored in the ROM 22 (S19). The value of the period constant $T_4$ is determined so that it may become equal to a period of time required for the rear edge of the latent image on the photosensitive sheet 10a to reach the pressure part 13 from the irradiation part 6.

When the registered period of time $t_2$ becomes equal to the value of the period constant $T_4$, it is noted that the rear edge of the latent image on the photosensitive sheet 10a and the same of the image receiving sheet 14 are overlapped each other and simultaneously pass through the pressure part 13, and thereby the image formation has been completed.

At this point of time, a count result $CT_2$ for the pulse signals by the counter of the input interface 24 is stored in the area preset on the RAM 23 as a variable $M_2$ (S20), and the pressure roller clutch 32 as well as the wind shaft clutch 33 is released from its operation, and therefore the drawing of the photosensitive sheet 10a is stopped (S21).

When the drawing of the photosensitive sheet 10a is stopped, at first the pressure motor 18c in the pressure device 18 is driven. Consequently, the pressure roller 8 is released from its contact with the main drum 7, thereby removing the pressure (S22). Next, when the pressure is removed, the rewind clutch 37 is actuated and transmits the rotations of the main motor 29 to the photosensitive sheet supply shaft 9 so that it may rotate in the reverse direction. In this way, winding back for the photosensitive sheet 10a is initiated (S23). At the same time, the counting for pulse signals released from the rotary encoder 12 is newly initiated (S24), and the count number is compared with the count result $CT_2$ stored as the variable $M_2$ (S25).

When the above count result $CT_3$ becomes equal to the value of the count result $CT_2$, it is noted that the same amount of the photosensitive sheet 10a is wound back as that drawn during the period constant $T_4$ whereby the rear edge of the latent image is transferred from the irradiation part 6 to the pressure part 13. Consequently, at this point of time the rewind clutch 37 is released from its operation and the winding back for the photosensitive sheet 10a is stopped (S26). After the photosensitive sheet 10a was wound back in this way, the pressure motor 18c is driven in the reverse direction and the pressure roller 8 is depressed onto the main drum 7, thereby getting back to a stand-by state capable of drawing the next portion of photosensitive sheet 10a (S27). Then the main motor 29 is stopped (S28). Finally remaining amount display processing is performed (S29), and an entire processing is completed.

As a result of the above operation, since a latent image is wound back to the irradiation part 6 after one cycle of the image forming processing, the next latent image is formed immediately after the preceding image, and therefore a wasteful consumption of the photosensitive sheet 10a is avoidable.

The following description deals with the above remaining amount display processing in detail referring to a flow chart in FIG. 4.

In this processing routine, at first the value of the count result $CT_1$, which is stored at S14 in FIG. 3 as the variable $M_1$, is successively compared with comparison constants 20, 40, 60 and 80 which are preset concerning to the remaining amount of the photosensitive sheet roll 10 (S31 to S34). Then if the value of the variable $M_1$ is less than the constant 20, all the four remaining amount indicator lamps 35a to 35d on the remaining amount display device 35 are permitted to come on (S35 to S38). If it is more than 20 but less than 40, the three remaining amount indicator lamps 35b to 35d are permitted to come on (S36 to S38). Similarly if it is more than 40 but less than 60, the two remaining amount indicator lamps 35c to 35d come on (S37 and 38), and if it is more than 60 but less than 80, the only one remaining amount indicator lamp 35d turns on (S38). Then in any one of the above cases, when the remaining amount indicator lamp 35d turns on at S38, the control program returns to the main routine shown in FIG. 3.

On the other hand, the count result $CT_1$ stored as the variable $M_1$ corresponds to the counted number of light pulses generated by the rotary encoder 12 during a fixed period of time(period constant $T_2$) as described before. When a remaining amount of the photosensitive sheet 10a is great, and therefore the outside diameter of the photosensitive sheet roll 10 is big, the angular velocity of the rotations of the photosensitive sheet roll 10, whereby the photosensitive sheet 10a is drawn at a fixed speed as described before, becomes relatively slower. Consequently, since the rotation amount of the photosensitive sheet roll 10 becomes smaller and therefore the number of light pulses gets fewer, the value of the count result $CT_1$ (a variable $M_1$) gets smaller. On the other hand, when the remaining amount is small and therefore the outside diameter of the photosensitive sheet roll 10 is small, the angular velocity of the rotations of the photosensitive sheet roll 10 becomes relatively faster. Consequently, since the number of light pulses gets more, the value of the count result $CT_1$ (a variable $M_1$) gets greater. As described above, by the process according to the count result $CT_1$ (a variable $M_1$), the number of the remaining amount indicator lamps 35a to 35d turned on is permitted to correspond to the remaining amount of the photosensitive sheet 10a.

However, if the value of the variable $M_1$ is more than the constant 80, it shows that there is only little amount of photosensitive sheet 10a left on the photosensitive sheet roll 10. Accordingly, when it is recognized at S34 that the value of the variable $M_1$ is more than the constant 80, the exchange indicator lamp $35_e$ on the remaining amount display device 35 turns on and off (S39), thereby indicating the exchange of the photosensitive sheet 10 (S40). In addition, the comparison constants 20 to 80 are determined so as to have the above relation in their correspondence to the count result $CT_1$, and are predeterminately stored in the ROM 22.

When the photosensitive sheet roll 10 is exchanged by a new one, the exchange indicator lamp 35e comes off, and all the four remaining amount indicator lamps 35a to 35d come on (S41), thereby returning to the main routine.

Consequently, in the display processing of remaining amount as is disclosed in the present embodiment, since the remaining amount display device 35 accurately indicates the remaining amount of the photosensitive sheet 10a every time one cycle of image forming processing is completed, the exchange of the photosensitive sheet roll 10 can be performed easily and appropriately.

(d) Operations of Control Part (2)

Figure 5:
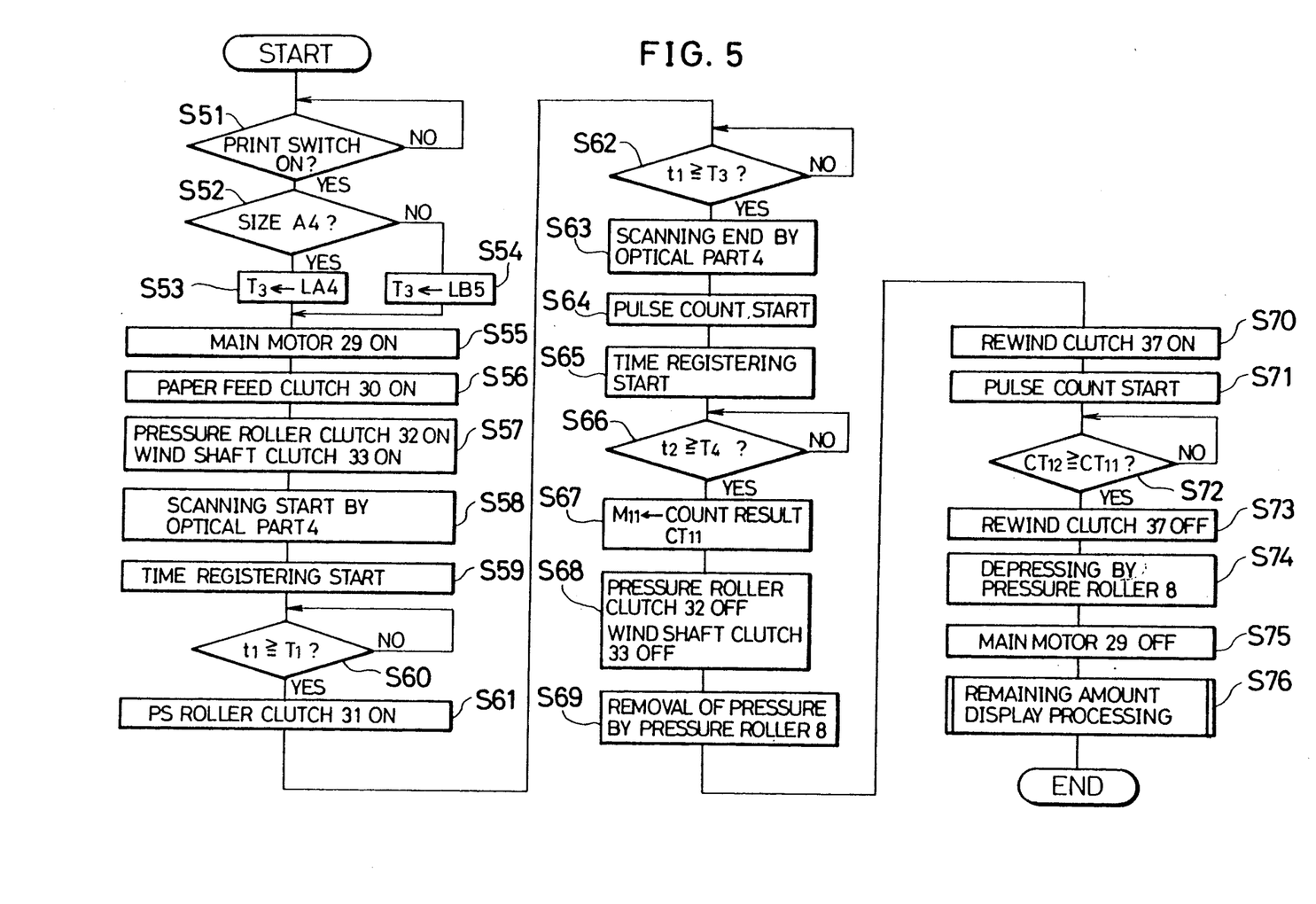
FIG. 5 is a flow chart showing other operations of a control part in a copying machine.

The following description deals with another example of the operations of the control part with respect to a copying machine having the above composition according to a flow chart in FIG. 5. In this description, an example is shown concerning a more simplified image forming processing wherein the count result $CT_2$, which is utilized in the winding back of the photosensitive sheet 10a, is also utilized as it is for the remaining amount display processing.

As is aforementioned, the value of a count result $CT_1$ corresponds to the number of pulse signals released by the rotary encoder 12 accompanying the rotations of the photosensitive sheet supply shaft 9 during a period from the scanning start by the optical part 4 until the registered time reaches the period constant $T_2$. The period constant $T_2$ is determined so that it may become equal to a proper period of time between the transport start of the image receiving sheet 14 by the PS roller 15c and the scanning end by the optical part 4. Since the processing for obtaining the count result $CT_1$ may be omitted, the following three steps are omitted in FIG. 3: S8 (the start of pulse count); S13 (the comparison between the registered period of time $t_1$ and the period constant $T_2$); and S14 (the count result $CT_1$ is stored in the area preset on the RAM 23 as a variable $M_1$).

The following description deals with the image forming processing simplified as is aforementioned in detail. As shown in FIG. 5, at first a copying process is initiated when the print switch is pressed in the operation input part 25 by the operator at Step 51. The processes from S51 to S57 are the same as S1 to S7. The step corresponding to S8 is omitted as aforementioned. The processes from S58 to S61 are the same as S9 to S12. The steps corresponding to S13 and S14 are omitted as aforementioned. In the same process as S15, after comparing the registered period of time $t_1$ with the period variable $T_3$, the scanning by the optical part 4 is completed (S63). In a state that the rear edge of a latent image on a photosensitive sheet 10a is still at the irradiation part 6, counting for pulse signals released from the rotary encoder 12 is initiated by the counter in the input interface 24 (S64) for the first time. Next, similarly to S18 and S19, time registering is initiated (S65), and the registered period of time $t_2$ as a variable is compared with the period constant $T_4$ (S66). As is aforementioned, the value of the period constant $T_4$ is equal to a period of time required for the rear edge of the latent image on the photosensitive sheet 10a to reach the pressure part 13 from the irradiation part 6, and is predeterminately stored in the ROM 22.

When the registered period of time $t_2$ becomes equal to the value of the period constant $T_4$, the image forming processing is completed, and a count result $CT_{11}$ (corresponding to the count result $CT_2$) is stored as a variable $M_{11}$ in the area preset on the RAM 23 (S67). The processes S68 and S69 are the same as S21 and S22. Next, similarly to S23 and S24, when the rewind clutch 37 is actuated, and the photosensitive sheet supply shaft 9 is rotated in the reverse direction to initiate the winding back for the photosensitive sheet 10a (S70), counting for pulses is initiated (S71). Then a count result $CT_{12}$ (corresponding to the count result $CT_3$) is compared with $CT_{11}$ stored as a variable $M_{11}$ (S72). However, the value stored as the variable $M_{11}$ is equal to that stored as the variable $M_2$ in FIG. 3, and there is no actual difference in their processing operations. There are no differences between the processes from S73 to the last S76 and those from S26 to the last S29.

Furthermore, in the remaining amount display processing at S76, the same kind of routine in structure as is shown in FIG. 4 may be used. However, in the flow chart shown in FIG. 4, the remaining amount of the photosensitive sheet roll 10 is detected according to the count result $CT_1$ during the period constant $T_2$. On the other hand, in the flow chart shown in FIG. 5, it is detected according to the count result $CT_{11}$ during the period constant $T_4$. Consequently, it is necessary to properly revise the values of comparison constants 20 to 80 according to the differences of values of the respective period constants. More specifically, for example, when $T_2 < T_4$, since the count result $CT_{11}$ becomes greater than the count result $CT_1$, it is necessary to change and preset the values of the comparison constants, which are given as (20, 40 and the like) in the processes S31 to S34 shown in FIG. 4, at greater values.

As a result of the above, since a latent image is wound back to the irradiation part 6 after one cycle of the image forming processing, the next latent image is formed immediately after the preceding image, and therefore a wasteful consumption of the photosensitive sheet 10a is avoidable. Besides, the value of a variable $M_{11}$ used in the winding back processing is also utilized as it is in the remaining amount display processing, and thereby the image forming processing can be more simplified.

Moreover, since it would be better to set a certain amount of interval between a preceding exposure portion and the succeeding exposure portion on the photosensitive sheet, a composition may be adopted wherein the winding back operation is stopped immediately before a rotation amount after the start of the winding back operation reaches the rotation amount to be compared with.

Furthermore, the latent image may be formed by forming a one-dimensional optical image in the width direction on the photosensitive sheet and then by scanning it in the length direction, besides the formation of an optical image on the photosensitive sheet by the entire exposure at one time. The latent image may also be formed by scanning laser spots or the like in the width direction and the length direction.

Furthermore, any kind of rotation detector may be used as the above-mentioned rotation detector as long as it may detect the rotation amount of the supply shaft. For example, such a device may be adopted wherein the rotation speed of the photosensitive sheet roll is detected, and by successively integrating the value, the rotation amount is obtained.

Moreover, the above-mentioned rotation detector may be installed either on the supply shaft itself or on other places in the rotation system rotating together with the supply shaft.

As aforementioned, the rewind device for photosensitive sheet according to the present invention comprises a supply shaft reversing device for winding back a photosensitive sheet by rotating a supply shaft in the reverse direction; a rotation detector for detecting the amount of rotation made by the photosensitive sheet roll; and measuring means for measuring the rotation amount of the photosensitive sheet roll in the drawing direction which is detected by the rotation detector in a fixed period of time as well as that in the reverse direction.

Consequently, since the photosensitive sheet is wound back so that a latent image formed on the photosensitive sheet may be located just before the irradiation part or adjacent thereto, the succeeding latent image is formed just behind the preceding latent image, and therefore a wasteful consumption of unexposed portion of the photosensitive sheet is preventable in the image forming apparatus of the photosensitive latent image transfer type. In addition, since the supply shaft reversing device may be operated simply to rotate the supply shaft in reverse at an optional speed until it is instructed to stop, the device may be composed of a very simple rotation transmission device or the like.

Accordingly, the rewind device for photosensitive sheet of the present invention has an effect in that it may constantly wind back a fixed amount of the photosensitive sheet by adding a simple composition thereto.

The invention being thus described, it may be obvious that the same may be varied in many ways. Such variations are not to be regarded as a departure from the scope of the invention.

There are described above novel features which the skilled man will appreciate give rise to advantages. These are each independent aspects of the invention to be covered by the present application, irrespective of whether or not they are included within the scope of the following claims.

What is claimed is:

1. A rewind device for a photosensitive sheet in an image forming apparatus comprising:
   supply shaft reversing means for winding back a photosensitive sheet by rotating a supply shaft rotatively supporting a photosensitive sheet roll in the reverse direction to the drawing direction of the photosensitive sheet;
   rotation detection means for detecting the amount of rotation made by the photosensitive sheet roll, which is secured to the rotation system of the supply shaft and;
   a control part which controls the supply shaft reversing means by measuring the rotation amount of the photosensitive sheet roll in the drawing direction detected by the rotation detection means in a fixed period of time as well as the same in the reverse direction and by comparing both of the rotation amounts with each other.

2. A rewind device for a photosensitive sheet in an image forming apparatus as defined in claim 1, wherein the control part comprises:
   first measuring means which measures a regular direction rotation amount of the photosensitive sheet roll detected by the rotation detection means in a period after the rear edge of a latent image passed an irradiation part for forming a latent image on the photosensitive sheet until it reaches a pressure part for depressing the photosensitive sheet onto an image receiving sheet to form a visible image;
   rewind start means for starting the winding back of the photosensitive sheet by the use of the supply shaft reversing means after the rear edge of the latent image reached the pressure part;
   second measuring means which measures a reverse direction rotation amount of the photosensitive sheet roll detected by the rotation detection means after the winding back of the photosensitive sheet was started by the supply shaft reversing device and;
   rewind stop means which stops the winding back of the photosensitive sheet by the supply shaft reversing device when the reverse direction rotation amount measured by the second measuring means becomes equal to the regular direction rotation amount measured by the first measuring means or immediately before it becomes equal to the amount.

3. A rewind device for a photosensitive sheet in an image forming apparatus as defined in claim 2, wherein the control part also comprises:
   time registering means which registers the time elapsed after the first measuring means started measuring the regular direction rotation amount of the photosensitive sheet as the rear edge of the latent image had passed the irradiation part until the first measuring means finishes the above-mentioned measurement as the rear edge of the latent image reached the pressure part and;
   comparison means which compares the reverse direction rotation amount measured by the second measuring means with the regular direction rotation amount measured by the first measuring means.

4. A rewind device for a photosensitive sheet in an image forming apparatus as defined in claim 3, wherein the rotation detection means includes a rotary encoder comprising a disc having slits formed through it every fixed rotation angles on the same circumference and a photo interrupter disposed having the disc in between which generates light pulses with a fixed time rate to the rotation cycle of the disc regardless of the rotation direction of the supply shaft.

5. A rewind device for a photosensitive sheet in an image forming apparatus as defined in claim 4, wherein each of the first and second measuring means comprises a counter which counts the number of pulse signals released by the rotation detection means.

6. A rewind device for a photosensitive sheet in an image forming apparatus as defined in claim 5, wherein the first measuring means, the rewind start means, the second measuring means, the rewind stop means, time registering means and the comparison means are microcomputer systems comprising ROM, RAM, input/output interface and CPU.

7. A rewind device for a photosensitive sheet in an image forming apparatus as defined in claim 1, wherein a method whereby the second measuring means measures the reverse direction rotation amount of the photosensitive sheet roll includes:
   a step wherein the rewind clutch is actuated;
   another step wherein the rotation of the main motor is transmitted to the supply shaft so as to rotate it in the reverse direction and the winding back of the photosensitive sheet is initiated and;
   the other step wherein counting for the rotation of the photosensitive sheet roll is newly initiated according to the pulse signals released by the rotary encoder.

8. A rewind device for a photosensitive sheet in an image forming apparatus as defined in claim 7, wherein a method whereby the rewind stop means stops the winding back of the photosensitive sheet by the supply shaft reversing device when the reverse direction rotation amount becomes equal to the regular direction rotation amount includes:
   a step wherein the newly counted count number is compared with the count result $CT_2$ stored as the variable $M_2$ and;
   the other step wherein when a count result $CT_3$ derived from the count number becomes equal to the count result $CT_2$, the rewind clutch is disengaged from its operative engagement and the winding back of the photosensitive sheet is stopped.

9. A rewind device for a photosensitive sheet in an image forming apparatus as defined in claim 8, wherein the rotation detection means detects the rotation amount, for example, by detecting the rotation speed of the photosensitive sheet roll and by successively integrating the value.

10. A rewind device for a photosensitive sheet in an image forming apparatus as defined in claim 9, wherein the rotation detection means is installed on the shaft itself or on other places in the rotation system rotating together with the supply shaft.

11. A rewind device for a photosensitive sheet in an image forming apparatus as defined in claim 10 which further comprises a remaining amount display device for displaying the remaining amount of the photosensitive sheet roll.

12. A rewind device for a photosensitive sheet in an image forming apparatus as defined in claim 11, wherein the input interface comprises a counter which counts the rotation of the photosensitive sheet roll detected by the rotary encoder and measures the rotation amount.

13. A rewind device for a photosensitive sheet in an image forming apparatus as defined in claim 6, wherein the supply shaft reversing means comprises a rewind clutch for transmitting the rotation of a main motor, which forms a power source for various driving parts of the image forming apparatus, so as to reverse the rotation direction of the supply shaft.

14. A rewind device for a photosensitive sheet in an image forming apparatus as defined in claim 13, wherein a method whereby the first measuring means measures the regular direction rotation amount of the photosensitive sheet roll includes:
   a step wherein a latent image of a document has been formed on a photosensitive sheet;
   another step wherein the counter starts counting the rotation of the photosensitive sheet roll according to the pulse signals released by the rotary encoder;
   another step wherein time registering means starts registering the period of time for the regular direction rotation amount measurement by the first measuring means;
   another step wherein the period of registered time is compared with a period constant $T_4$ which is preset in the ROM and has an equivalent value to a fixed time which is required for the rear edge of the latent image to reach the pressure part from the irradiation part after a latent image was formed on the photosensitive sheet and;
   the other step wherein when the period of registered time becomes equal to the period constant $T_4$, a count result $CT_2$ which has been marked by the counter during the period is stored in an area preset on the RAM as a variable $M_2$.

* * * * *